(12) United States Patent
White et al.

(10) Patent No.: US 8,191,359 B2
(45) Date of Patent: Jun. 5, 2012

(54) MOTION ESTIMATION USING HIDDEN MARKOV MODEL PROCESSING IN MRI AND OTHER APPLICATIONS

(75) Inventors: Nathan White, San Diego, CA (US); Anders Dale, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 1205 days.

(21) Appl. No.: 11/735,409

(22) Filed: Apr. 13, 2007

(65) Prior Publication Data

US 2007/0253599 A1 Nov. 1, 2007

Related U.S. Application Data

(60) Provisional application No. 60/792,139, filed on Apr. 13, 2006.

(51) Int. Cl.
*A61B 5/05* (2006.01)
(52) U.S. Cl. ............ 60/407; 382/107; 382/128; 382/275
(58) Field of Classification Search .................. 600/407, 600/414, 425, 426, 436, 437; 382/107, 128, 382/275; 324/309; 702/127, 142, 147, 175, 702/196, 197
See application file for complete search history.

(56) References Cited

U.S. PATENT DOCUMENTS

| | | | | |
|---|---|---|---|---|
| 6,587,707 B2 * | 7/2003 | Nehrke et al. | ................ | 600/410 |
| 7,022,077 B2 * | 4/2006 | Mourad et al. | ................ | 600/449 |
| 2005/0107808 A1 * | 5/2005 | Evans et al. | ................ | 606/139 |
| 2005/0143634 A1 * | 6/2005 | Baker et al. | ................ | 600/310 |
| 2006/0001424 A1 | 1/2006 | Harvey et al. | | |

OTHER PUBLICATIONS

"Hidden Markov model" Wikipedia, the free encyclopedia, http://en.wikipedia.org/wiki/Hidden_Markov_model [accessed on Apr. 12, 2006], 4 pages.
"Kalman Filter" Wikipedia, the free encyclopedia, http://en.wikipedia.org/wiki/Kalman_filter [accessed on Apr. 12, 2006], 15 pages.
"Recursive Bayesian estimation" Wikipedia, the free encyclopedia, http://en.wikipedia.org/wiki/Recursive_Bayesian_estimation [accessed on Apr. 12, 2006], 3 pages.
"Motion Correction," Magnetic Resonance Research Laboratory, Mayo Clinic, http://mayoresearch.mayo.edu/mayo/research/mri-lab/motion_correction.cfm [accessed Apr. 11, 2006] 3 pages.
Bernstein, M.A., Y. Shu, and A.M. Elliott, "Ringlet motion correction for 3D MRI acquired with the elliptical centric view order," Magn Reson Med, 50(4): p. 802-12 (2003).
Costa, A.F., et al., "Using the axis of rotation of polar navigator echoes to rapidly measure 3D rigid-body motion," Magn Reson Med, 2005. 53(1):150-158 (2005).
Derbyshire, J.A., et al., "Dynamic scan-plane tracking using MR position monitoring," J Magn Reson Imaging, 8(4): 924-932 (1998).

(Continued)

*Primary Examiner* — Brian Casler
*Assistant Examiner* — Daniel Huntley
(74) *Attorney, Agent, or Firm* — Perkins Coie LLP (57) ABSTRACT

Systems, apparatus and methods that use a hidden Markov model to estimate motion of a sample under measurement and to reduce a motion-induced effect in the measurement. MRI systems and other sample measurement systems can be implemented based on motion sensing using the hidden Markov model. Recursive and non-recursive estimation processes are described.

60 Claims, 7 Drawing Sheets

Schematic illustrating how the EKF algorithm can be used for motion insensitive MRI

OTHER PUBLICATIONS

Dietrich, O., et al., "Reducing motion artefacts in diffusion-weighted MRI of the brain: efficacy of navigator echo correction and pulse triggering,". Neuroradiology, 42(2): 85-91 (2000).

Ehman, R.L. and J.P. Felmlee, "Adaptive Technique for High-Definition MR Imaging of Moving Structures," Radiology 173: 255-263 (1989).

Fu, Z.W., et al., "Orbital navigator echoes for motion measurements in magnetic resonance imaging," Magn Reson Med, 34(5): 746-753 (1995).

Kadah, Y.M., et al., "Floating navigator echo (FNAV) for in-plane 2D translational motion estimation," Magn Reson Med, 51(2): 403-407 (2004).

Manduca, A. et al., "Autocorrection in MR Imaging: Adaptive Motion Correction without Navigator Echoes," Radiology 215: 904-909 (2000).

Mori, S. and P.C. van Zijl, "A motion correction scheme by twin-echo navigation for diffusion-weighted magnetic resonance imaging with multiple RF echo acquisition," Magn Reson Med, 40(4): 511-516 (1998).

Moriguchi, H., J.S. Lewin, and J.L. Duerk, "Novel interleaved spiral imaging motion correction technique using orbital navigators," Magn Reson Med, 50(2): p. 423-428 (2003).

Nehrke, K. and P. Börnert, "Prospective Correction of Affine Motion for Arbitrary MR Sequences on a Clinical Scanner," Magnetic Resonance in Medicine 54; 1130-1138 (2005).

Peshkovsky, A. et al., "Motion correction in MRI using an apparatus for dynamic angular position tracking (ADAPT)," Magn Reson Med, 49(1): 138-143 (2003).

Sachs, T.S., et al., "Real-time motion detection in spiral MRI using navigators," Magn Reson Med, 32(5): 639-645 (1994).

Shankaranarayanan, A., "Motion Insensitive 3D Imaging Using a Novel Real-Time Image-Based 3D PROspective MOtion Correction Method (3D Promo)," ISMRM 15th Scientific Meeting, p. 2117, Berlin, Germany, May 19-25, 2007.

Speck et al., "Prospective real-time slice-by-slice motion correction for fMRI in freely moving subjects," Mag Reson Mater Phy 19: 55-61 (2006).

Thesen, S. et al., "Prospective Acquisition Correction for Head Motion With Image-Based Tracking for Real-Time fMRI" Magnetic Resonance in Medicine 44:457-465 (2000).

van der Kouwe AJW, and A.M. Dale, "Rapid real-time prospective rigid body motion correction during imaging using cloverleaf navigators," in Proc. Intl. Soc. Mag. Reson. Med. 11: 95 (2004), ISMRM 12th Annual Meeting, Kyoto, Japan, May 15-21, 2004.

Wan, Eric and Alex Nelson "Dual Extended Kalman Filter Methods" Chapter 5 in Kalman Filtering and Neural Networks, edited by S. Haykin, New York: John Wiley & Sons, 2001, pp. 123-173.

Wan, Eric, Rudolph van der Merwe and Alex Nelson, "Dual estimation and the unscented transformation" in Advances in Neural Information Processing Systems 12, Proceedings of the 1999 Conference, Solla, S.A. et al. (Eds.), London, England, MIT Press, 2000, pp. 666-672.

Ward, H.A., et al., "Prospective multiaxial motion correction for fMRI,". Magn Reson Med, 43(3): 459-469 (2000).

Weih, K.S., et al., "Online motion correction for diffusion-weighted segmented-EPI and FLASH imaging," Magma, 16(6): p. 277-283 (2004).

Welch, E.B., et al., "Spherical navigator echoes for full 3D rigid body motion measurement in MRI," Magn Reson Med, 47(1): 32-41 (2002).

Welch, E.B., et al., "Interscan registration using navigator echoes,". Magn Reson Med, 52(6): 1448-1452 (2004).

White, Nathan S. et al., "Prospective Motion Correction Using Nonlinear Predictive Filtering" Joint Annual Meeting ISMRM-ESMRMB p. 1829, Berlin, Germany, May 19-25, 2007.

* cited by examiner

Figure 1. Schematic illustrating how the EKF algorithm can be used for motion insensitive MRI

Figure 2. Proof of concept of the EKF algorithm for estimating subject motion in MRI. MRI data was simulated with a 1mm motion translation in the x direction at slice number 20. The EKF algorithm, as implemented in Figure 1, is able to accurately estimate the true motion in the simulated data.

MOTION ESTIMATION USING HIDDEN MARKOV MODEL PROCESSING IN MRI AND OTHER APPLICATIONS

This application claims the benefit of U.S. Provisional Application No. 60/792,139 entitled "DYNAMIC MOTION ESTIMATION USING HIDDEN MARKOV MODEL PROCESSING AND IMPLEMENTATIONS IN MOTION-INSENSITIVE MAGNETIC RESONANCE IMAGING (MRI) AND OTHER APPLICATIONS" and filed Apr. 13, 2006, which is incorporated by reference as part of the specification of this application.

FEDERALLY SPONSORED RESEARCH OR DEVELOPMENT

This invention was made with government support under contract No. R01 EB00790 awarded by the National Institutes of Health (NIH). The government has certain rights in the invention.

BACKGROUND

This application relates to techniques for estimating motion and applications of such techniques in various applications including imaging applications such as magnetic resonance imaging (MRI), positron emission tomography (PET) imaging, computed tomography (CT) imaging, and ultrasound imaging.

Imaging through MRI techniques is well known and has been widely applied in imaging applications in medical, biological and other fields. An MRI system produces an image of a sample or a selected body part of a subject (e.g., a person or an animal) under examination by manipulating the magnetic spins in the body part and processing measured responses from the magnetic spins. In some implementations, an MRI system may include hardware to generate different magnetic fields for imaging, including a static magnetic field along a z-direction to polarize the magnetic spins, gradient fields along mutually orthogonal x, y, or z directions to spatially select a body part for imaging, and an RF magnetic field to manipulate the spins.

When the sample or the subject under imaging moves, the obtained MRI images may exhibit motion artifacts that degrade the images. The nature of the motion artifact depends upon when the subject or sample moves during the MRI pulse sequence. Motion artifacts can be caused by various sources, including mechanical vibrations of the subject or sample. Such motion artifacts can be problematic when imaging a living subject such as a person or an animal because physiological effects such as involuntary motion, cardiac pulsations, blood flow, respiration, and eye movements may lead to large motion artifacts. Physical restraints of the subject may help immobilize the subject during scan acquisition, but these restraints are generally difficult to use, uncomfortable for the subject, and cannot fully prevent motion artifact in these data. Hence, there is a need to reduce the motion artifacts in MRI images.

Various techniques have been developed to correct for motion artifacts in MRI, such as retrospective motion correction techniques and prospective motion correction techniques. Retrospective motion correction techniques correct for motion artifact after the data have been collected using post processing techniques. Implementations of retrospective motion correction techniques have various limitations in removing motion artifact. For example, it can be difficult for various retrospective correction techniques to correct for the motion-induced changes in the spin excitation history (spin history effects) or motion artifacts caused by motion that occurs during the scan itself (e.g. intra-scan motion); some retrospective motion correction techniques can introduce blurring in the images because the images are resampled into a common spatial coordinate system.

Prospective motion correction techniques correct for motion artifact during the scan process and thus are generally considered superior at correcting for motion artifact when compared to retrospective motion correction techniques. In implementation, the motion of the sample is tracked or estimated sequentially in time during the scan acquisition period. One method for tracking the motion of the sample or subject during the scan acquisition is to use navigator scans or navigator echoes. Prospective motion correction techniques which use navigator echoes for motion tracking are generally referred to as navigated MRI sequences. There are many different types of navigator echoes depending upon how the navigator echoes are collected and there are many different techniques to estimate motion from the navigator echoes. Some common types of navigator echoes include orbital navigator echoes, cloverleaf navigator echoes, spherical navigator echoes, and spiral navigator echoes. Typically, the navigator echoes only acquire data in a small portion of k-space and therefore the limited amount of information about the sample or subject contained in these navigator echoes makes accurate and rapid estimation of the motion of the sample or subject difficult. Multiple navigator echoes can be repeated one after another so that a more accurate estimate of the motion can be obtained.

Some other examples of prospective motion correction techniques of MRI data include tracking fiducial markers which are visible in the MR image and optical tracking of reflectors fixed to the subject. Self-navigating MRI sequences can also be used to estimate motion of the sample from the acquired MRI data for prospective motion correction of MRI data.

SUMMARY

This application describes, among others, implementations of systems, apparatus and methods that use a hidden Markov model to estimation motion of a sample under measurement and to reduce a motion-induced effect in the measurement. MRI systems and other sample measurement systems can be implemented based on motion sensing using the hidden Markov model. In one implementation, a technique is described to dynamically estimate subject motion using acquired data from the subject during a data acquisition process using a motion estimation techniques based on a hidden Markov model. In another implementation, a method for sensing motion in a sample includes obtaining biomedical imaging data of the sample; and applying a mathematical model of temporal dynamics between a motion of the sample and the biomedical imaging data to process the biomedical imaging data and to sense the motion in the sample. In another implementation, a method for sensing motion of a sample in magnetic resonance imaging (MRI) includes applying a method for estimating the states or parameters of a hidden Markov model to estimate a motion of the sample from acquired MRI data; and using the estimated motion to control a MRI gradient to reduce an effect of the motion of the sample. Both recursive and non-recursive estimation processes may be used to estimate the states or parameters of the hidden Markov model.

In yet another implementation, a method for sensing motion of a sample under measurement of a system includes obtaining measured data of the sample from the system and the measured data is not direct data on a motion in the sample and a property of the measured data is affected by the motion in the sample. This method also includes applying a hidden Markov model of temporal dynamics between a motion of the sample and the measured data to process the measured data for sensing the motion in the sample.

In yet another implementation, a system includes a measurement module operable to measure a sample; and a processor operable to apply a hidden Markov model of temporal dynamics between a motion of the sample and measured data from the sample to process the measured data and to provide information on a motion in or of the sample.

These and other implementations are described in detail in the attached drawings, the description and the claims.

DETAILED DESCRIPTION

Implementations of the dynamic estimation of subject motion using acquired data from the subject during the data acquisition process are described in specific examples in MRI imaging. Various features of the dynamic estimation of subject motion can be used for dynamic estimation of subject motion in other sensing or imaging applications beyond the MRI imaging. As an example in an MRI imaging system, the motion estimation process may be implemented to provide a real-time motion estimation so that the obtained motion information from the motion estimation can be used, during the MRI data acquisition, to adjust the imaging gradients and or radio frequency signals of an MRI system based on the estimated motion to reduce the motion artifacts in the MRI images. This real time adjustment of the imaging gradients and or radio frequency (RF) signals of the MRI system may be achieved after each individual readout acquisition (e.g. 2D imaging slice in single-shot echo planar imaging data). In 2D single-shot echo planar imaging data, the time allowed for this real time adjustment is dictated by the rate for acquiring MRI data of each slice of the multiple slices of a target area of a sample or subject. This approach to motion estimation can be used in other applications beyond MRI imaging applications, such as other imaging applications different from MRI and non-imaging applications.

In one implementation, this application provides a method for sensing motion of a sample under measurement of a system to obtain measured data of the sample from the system. The measured data is not direct data on a motion in the sample and a property of the measured data is affected by the motion in the sample. In this method, a hidden Markov model of the temporal dynamics between a motion of the sample and the measured data is applied to process the measured data for sensing the motion in the sample. Examples based on the use of motion estimation in MRI are provided to illustrate various features in the motion estimation.

In MRI, an image is formed through the processes of spin excitation, signal encoding or preparation, and signal reception or readout. Let r be a position vector in object space and r' be a position vector in scanner space. Motion of the imaging object describes a mapping between object space and scanner space such that r→r'(r,t). Spin excitation can be described by the following general equation:

$$m_T(r) = im_0 \int_0^T B_1(t) \exp\left(i\gamma \int_t^T G(\tau) \cdot r'(r, \tau) d\tau\right) dt \qquad (0.1)$$

where $m_T$ is the transverse magnetization pattern after excitation disturbed by motion, $m_0$ is the initial longitudinal magnetization, $B_1$ is the radio frequency (RF) waveform, $\gamma$ is the geomagnetic ratio, and $G(t)=[G_x(t)\ G_y(t)\ G_z(t)]^T$ is a vector of applied gradient waveforms. After spin excitation, the MRI signal encoding and reception can be described by the general equation:

$$S_q(t) = \int_r \Omega(r'(r,t))\rho(r)\exp\left(-i\gamma \int_0^t G(\tau) \cdot r'(r, \tau) d\tau\right) dr \qquad (0.2)$$

where $S_q(t)$ is the received MRI signal in channel q, $\Omega$ is the coil sensitivity profile, and $\rho$ is the spin density.

The motion of the sample, e.g., the change in the position of the sample which maps the spatial coordinate r in the object space to the spatial coordinate r' in the MRI scanner space via the function r'(r,t), can be difficult to measure with a high accuracy in actual MRI systems. Therefore, the techniques in this application use the measurable MRI signal from the sample to estimate the motion of the sample without relying on measurements of direction motion or changes in position of the sample. This motion estimation can be achieved by processing under a hidden Markov model (HMM) where the unknown state of the system is modeled as a Markov process, and the underlying technical process for the motion estimation is to determine the unknown states or parameters of the Markov model, from the observable measurements, based on this assumption. The extracted model states and parameters if they are unknown can then be used to perform further analysis.

A hidden Markov model (HMM) is a well known statistical model and be considered as a simplified dynamic Bayesian network which is a probabilistic graphical model that represents a set of variables and their causal influences or probabilistic dependencies. The state of a hidden Markov model is not directly visible. However, variables influenced by the state are visible. Each state has a probability distribution over the possible output tokens. Therefore the sequence of tokens generated by an HMM gives some information about the sequence of states. Under this hidden Markov model approach to the motion estimation in MRI and other sensing or imaging applications, various well-known recursive or non-recursive Bayesian estimation techniques can be applied to perform the motion estimation. Recursive Bayesian estimation is a general probabilistic approach for performing "online" estimates of an unknown probability density function, such as the motion vector function of the sample in the MRI system recursively over time using incoming measurements in real time during the measurements. One example of such real time measurement is MRI data continuously taken by an MRI system. A suitable recursive Bayesian filter for such online processing can be used to estimate the hidden states (e.g., the head motion of a subject) of this model recursively (or sequentially) in time. As an example, a sequential Bayesian filter can be used, in a probabilistic sense, to estimate these hidden states. As another example, an extended Kalman filter, a nonlinear filter, can also be used to estimate the hidden states.

Non-recursive Bayesian estimation techniques, or iterated Bayesian estimation methods, can also be used for estimating the hidden states or parameters of the hidden Markov model offline, i.e., after the measurements are completed. Examples include the Extended Kalman Smoother or the Iterated Extended Kalman Filter.

In MRI, the MRI response is affected by the motion of the sample, often in a nonlinear manner. Hence, a nonlinear recursive Bayesian filter can be used for motion estimation in MRI. As a specific example for applying the hidden Markov Model in MRI motion estimation, the following sections describe the use of the extended Kalman filter (EKF) for motion estimation in MRI. In an extended Kalman filter, the state transition and observation models need not be linear functions of the state but may instead be differentiable functions. The EKF is used to accurately estimate subject motion in real-time from the acquired MRI data. These estimates can be used to dynamically adjust the MRI gradient waveforms G and or the applied RF waveform $B_1$ which may significantly reduce motion artifact in the acquired images.

Implementations of a recursive Bayesian filter such as EKF may be configured to achieve certain operational advantages, including one or more of the following: 1) the algorithm operates in real-time and is thus able to correct for motion after each readout and thus is able to correct for intra-volume subject motion in 2D MRI datasets such as single-shot echo-planar imaging; 2) the algorithm is not limited to self-navigated functional MRI (fMRI) datasets but can be used on numerous other self-navigated 2D MRI image sequences and also navigated 3D MRI datasets where rapid real-time estimates of motion are required using navigator data; 3) the algorithm provides a framework for incorporating prior knowledge about typical subject movements into the estimation procedure which can aid in the accuracy of the motion estimates; and 4) the algorithm produces accurate and reliable estimates of subject motion without requiring an iterative optimization algorithm to estimate the motion but rater is able to estimate motion sequentially in real-time.

The Extended Kalman Filter (EKF) is a popular engineering tool for real-time online state estimation of non-linear dynamic systems. The dynamic motion estimate described here uses the EKF to infer the motion of the sample from the MRI signal from the MRI scanner in real-time.

A change in the 3D position of the sample within the MRI scanner environment can be represented by a rigid-body affine transform which maps the spatial position vector r in object space to the spatial position vector r' in scanner space through the function $r \rightarrow r'(r,t)=M(t)r+d(t)$ where $M(t) \in \Re^{3 \times 3}$ is a rotation matrix parameterized by a vector $m=[m_1\ m_2\ m_3]$ and $d(t)=[d_1\ d_2\ d_3]^T$ is a translation vector. A change in the 3D position of the sample, provided the motion is rigid-body, can thus be represented by a single six element parameter vector $x=[m;d]$, where x is therefore the state of the non-linear dynamic system to be estimated using the EKF. In our implementation, x propagates in discrete-time (k) according to $$x_k = Ax_{k-1} + w_{k-1} \quad (0.3)$$

with $$p(w_k) \sim N(0,Q). \quad (0.4)$$

where p is a noise distribution of a noise vector w that is caused by the motion of the sample, Q is a 6×6 covariance matrix describing prior knowledge about subject motion within the scanner environment, A is a 6×6 matrix of the system dynamics. The state vector x is not measured directly and information on the state vector x is extracted and monitored through the following EKF measurement $$z_k = h(x_k) + v_k \quad (0.5)$$

with $$p(v) \sim N(0,R) \quad (0.6)$$

The vector z is the measurable parameter vector and the vector v is a noise vector representing noise contributions from MRI hardware and the sample.

In this implementation, $z \in R^n$ is a vector of MRI voxel intensities. R is an n×n covariance matrix describing the noise structure in the MRI data. h is a non-linear function describing the re-sampling of the MRI volume at position $x_k$. The functional form of h is not required in measuring the measurable voxel intensity vector z and the jacobian $$H = \left. \frac{\delta h}{\delta x} \right|_{\hat{x}_k}$$

is used in measuring the measurable voxel intensity vector z.

The EKF time- and measurement-update equations describe how the position of the subject $x_k$ is estimated using the MRI voxel intensity values $z_k$. The operation of the extended Kalman Filter can be divided into a prediction process (PREDICT) and a subsequent correction (CORRECT) or update process. Table 1 and Table 2 show the equations for the PREDICT process and the CORRECT process, respectively.

TABLE 1

| EKF time-update equations (PREDICT) | |
| --- | --- |
| $\hat{x}_k = A\hat{x}_{k-1}$ $P_k = AP_{k-1}A^T + Q$ | (0.7) |

The time-update equations in Table 1 are performed prior to the collection of the MRI voxel intensity values at a given time point k in the scan acquisition. Once the MRI data is received, the position estimate $\hat{x}_k$ and covariance $P_k$ are updated using the standard EKF measurement-update equations in Table 2.

TABLE 2

| EKF measurement-update equations (CORRECT) | |
| --- | --- |
| $K_k = P_k H_k^T (H_k P_k H_k^T + R)^{-1}$ $\hat{x}_k = \hat{x}_k + K_k (z_k - h(\hat{x}_k, 0))$ $P_k = (I - K_k H_k) P_k$ | (0.8) |

Figure 1:
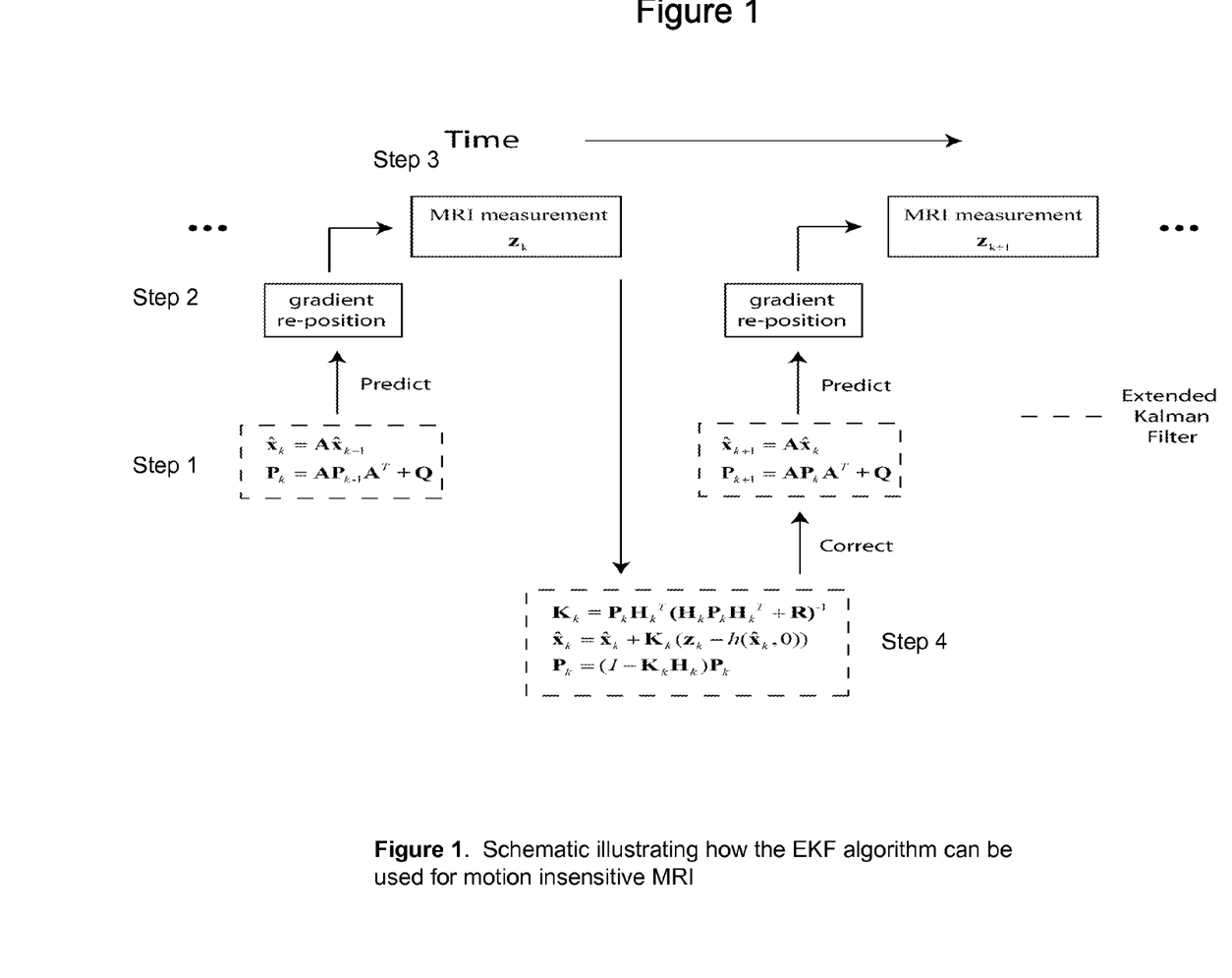
FIG. 1 shows an example of extended Kalman filter algorithm in processing MRI data to reduce motion-induced artifacts.

FIG. 1 shows a schematic of one example of the EKF algorithm for dynamic motion estimate. Each processing cycle in the recursive processing includes 4 sequential processing steps. Step 1: a model of the motion dynamics (matrix A in equation 0.3) is used together with the previous motion estimate to predict what the motion should be at the current time-step. Step 2: the magnetic gradient along at least one of the three orthogonal directions x, y and z is adjusted based on the predicted motion state. Subsequently at Step 3, new MRI data is acquired for the present motion state. At Step 4 which is after the completion of Step 3, the difference between the predicted MRI data from the predicted motion state and the actually measured MRI data is computed by $(z_k - h(x_k, 0))$ as shown in Eq. (0.8) and this difference is used to produce an updated or corrected motion state. This corrected motion state is then used for the next processing cycle in time, e.g., the next prediction step in the next processing cycle.

In operation, the steps 1 and 2 are separated by a small time delay and hence may be considered as "simultaneously" in practical implementations. The processing is delayed in time from an MRI data acquisition by a data sampling period for acquiring the data. As an example, assuming a particular MRI system divides a person's brain into 20 slices and the data acquisition for each slice takes 0.1 sec, then the delay is 0.1 sec although the total time for measuring the all 20 slices of the brain is 20×0.1 sec=2 sec.

Figure 2:
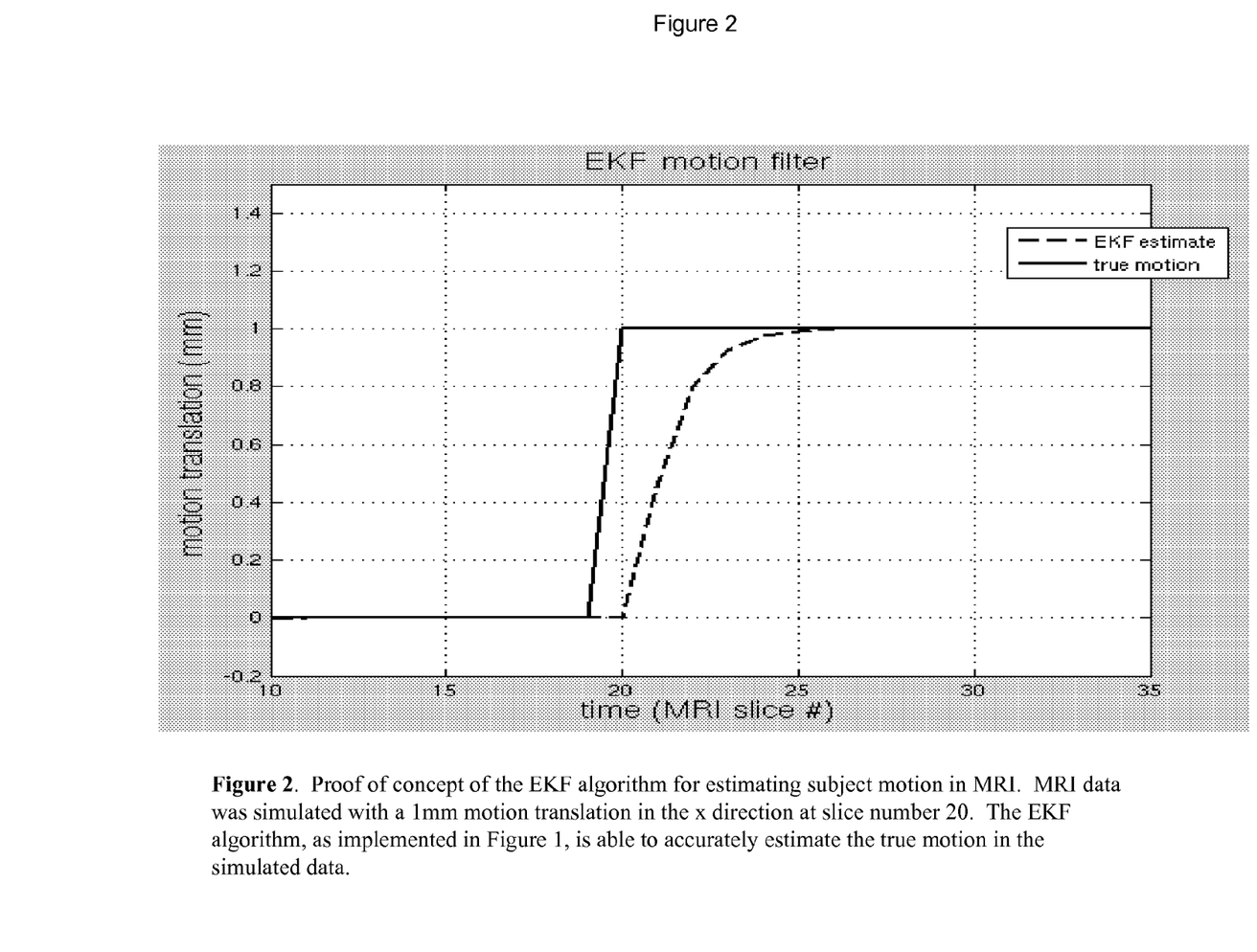
FIG. 2 illustrates a computer model simulation of the EKF motion estimation with 4D simulated fMRI data (3D data in space and 1D data in time).

FIG. 2 illustrates a computer model simulation of the EKF motion estimation with 4D simulated fMRI data (3D data in space and 1D data in time). This and other computer simulations demonstrated that the EKF algorithm is capable of estimating the motion in the simulated data.

Figure 3A:
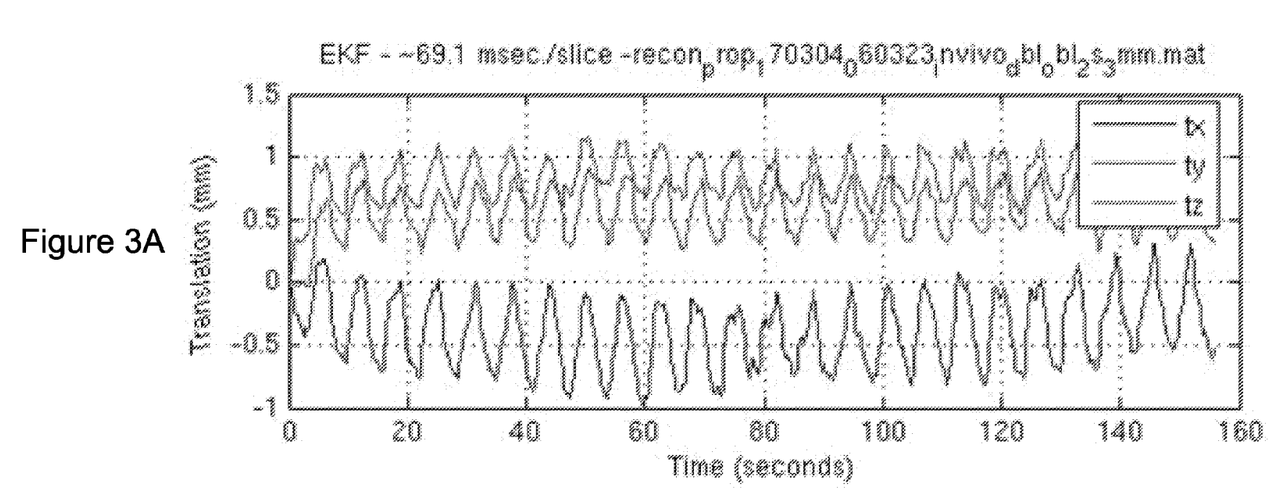
FIGS. 3A and 3B further show EKF motion estimation of the head motion in real MRI data obtained from a patient whose head was moving in a periodic fashion.
Figure 3B:
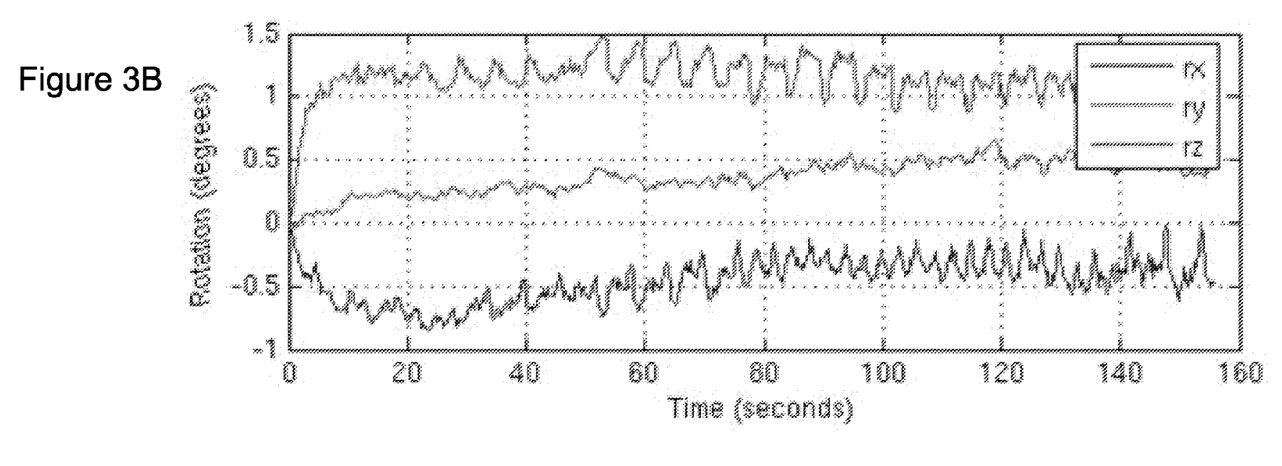

FIGS. 3A and 3B further show EKF motion estimation of the head motion in real MRI data obtained from a patient whose head was moving in a periodic fashion. The extended Kalman filter method was able to track the head motion. FIG. 3A shows EKF-generated translation motion of the head along x, y and z directions from real MRI data. FIG. 3B shows EKF-generated rotational motion of the head around the x, y and z directions from the real MRI data.

Referring to FIG. 1, the MRI gradient G in the MRI pulse sequence in step 2 is adjusted to reduce the motion artifacts in the acquired MRI images by feeding the estimated motion information to control the MRI gradient. For example, if a motion along the x direction is detected, the gradient in the x direction is adjusted to reduce the motion artifacts caused by this motion along the x direction. If a motion along x, y and z is detected, then the gradients along x, y and z directions are adjusted. One example of the feedback for controlling the MRI gradient using an estimated motion state is described in an article entitled "Prospective Acquisition Correction for Head Motion With Image-Based Tracking for Real-Time fMRI" and authored by Stefan Thesen, Oliver Heid, Edgar Mueller and Lothar R. Schad in Magnetic Resonance in Medicine 44:457-465 (2000) which is incorporated by reference as part of the specification of this application.

As shown in Equations (0.1) and (0.2), general motion of the sample during the MRI imaging processes of slice excitation and signal encoding and reception results in a modified phase term:

$$\phi'(r, t) = \gamma \int_0^t G(\tau) \cdot r'(r, \tau) d\tau \quad (0.9)$$

If there was no motion in the sample and thus the object coordinates and scanner coordinates are equalized then equation 0.9 reduces to:

$$\phi'(r, t) = \gamma \int_0^t G(\tau) \cdot r d\tau \quad (1.0)$$

Together, equations 0.9 and 1.0 illustrates that one can prospectively compensate for motion of the imaging object or subject by equating the phase terms such that:

$$\gamma \int_0^t G_c(t) \cdot r'(r, t) dt = \gamma \int_0^t G(t) \cdot r dt \quad (1.1)$$

where $G_c(t)$ is the corrected gradient waveform. When the motion of the sample is rigid-body this can be achieved by applying a corrected gradient waveform $G_c(t) = G(t)M(t)^{-1}$ and (de)modulating transmit and receive RF signals with the phase factor of:

$$\exp\left(-i\gamma \int_0^t G(\tau)M(\tau)^{-1} \cdot d(\tau) d\tau\right) \quad (1.2)$$

The motion estimation techniques described above may be applied in a wide range of applications beyond MRI imaging where motion artifacts are present. In some applications, motion artifacts can have adverse effects and thus are undesirable. The described implementations of the motion estimation apply a hidden Markov model for the motion to process observable measurements or data directly obtained from a system of interest (e.g., an imaging system), without relying on measurements coming from an external motion-tracking device, to optimally estimate a motion in real-time as the measurements are being acquired in the system of interest (with a delay due to the time needed for processing the measurements). Hence, the motion can be estimated without a separated and designated motion tracking device. The result of the motion estimation under the hidden Markov model can be used to dynamically adjust the system to reduce the motion artifacts. Certainly, in some implementations, a separated and designated motion tracking mechanism may be implemented to obtain information of the motion and such information may be combined with the motion information obtained from the motion estimation under the hidden Markov model to analyze the motion. Other motion tracking techniques such as MRI navigator echoes may also be used in combination with the present dynamic motion estimation based on the imaging data to reduce the motion artifacts.

The example for the motion model described above corresponds to the rigid-body motion of the object or sample. This method is not limited to estimating rigid-body motion only, and can be used to estimate other motions such as a motion that can be represented by a parameterized motion model r'(r,t). The parameterized motion model r'(r,t) describes the mapping between the object coordinate system and the coordinate system of the MRI scanner or other imaging system. Such mapping can reflect general affine motion or non-linear motion (e.g., shape deformation) and the motion estimation based on this mapping can be used to measure and monitor non-rigid-body motion such as affine motion or non-linear motion and to adjust an imaging condition (e.g., adjusting a MRI gradient) to reduce an effect caused by the non-rigid-body motion.

In one implementation, an EKF-based motion estimation for non-rigid-body motion can use (1) a state vector that includes variables which parameterize the non-linear motion of the object or sample, and (2) an augmented observation equation that relates the measurements to such state variables. If the object or sample undergoes non-rigid motion during an imaging scan, the EKF with an augmented state vector can be used to estimate this non-rigid motion. Extending the EKF motion estimation in this way can be used to improve the accuracy of the rigid-body motion tracking where both the rigid-body component and non-rigid-body component of the objects motion are used to update the MRI imaging gradients. In addition to dynamic motion estimation, this EKF motion estimation can also be used to improve offline image reconstruction and reduction of motion artifact after completion of the MRI imaging acquisition where the information of the non-rigid-body motion components of the object motion can be used to reduce motion-induced distortions in the reconstructed image. This tool has applications in biomedical imaging of deformable objects such as, for example, Coronary Magnetic Resonance Angiography (MRA) and abdominal MRI both of which suffer from motion artifact cause by non-rigid motion of the object during scanning.

The hidden Markov model processing can also be used to estimate one or more parameters or factors describing the imaging process beyond the motion of the object. For example, the spin density of the object may change with time due to one or more factors, for example, a change in the physiological response of the object. This time-varying spin density may be written as a function of time $\rho(r,t)$ and a hidden Markov model processing may be applied to estimate the dynamic change in the spin density of the object. The parameters describing the change in the spin density may be estimated dynamically using, for example, a second EKF process running in parallel with the EKF process that is used to estimate the motion of the object.

Similar to the motion estimation based on the EKF process, a non-motion parameter of the object can be estimated recursively using, for example, a second EKF process. These two EKFs can be operated in parallel, their outputs can be used to inform one another. For example, in MRI applications, a second EKF can be used to track the longitudinal magnetization or the shim field of the imaging object. These additional estimates can then be used to inform the original EKF which tracks the object motion. The longitudinal magnetization estimate at each time point (EKF iteration) can be used to modify the observation equation of the motion tracking EKF thereby allowing the motion tracking EKF to better predict the measurements, thus reducing the processing of the motion tracking EKF and producing more accurate estimates of the objects motion and better motion artifact reduction in the scan.

In one application, this method of using multiple EKFs to estimate other parameters of interest can be used to simultaneously estimate the parameters describing the motion of the object. If equation 0.7 is replaced by a time-varying equation set of the form:

$$x_k = A_k x_{k-1}$$

$$P_k = A_k P_{k-1} A_k^T + Q_k$$

that the above equation shows that additional EKFs can be used to simultaneously estimate the time-varying parameters of A and Q. Various aspects of using multiple EKFs to simultaneously estimate the parameters describing the motion of the object are described in a chapter entitled "Dual EKF Methods" by Eric Wan and Alex Nelson in Kalman Filtering and Neural Networks, edited by S. Haykin (Wiley, 2001) where a use of the EKF and additional nonlinear filter called the unscented Kalman filter (UKF) is described. Also, see a chapter entitled "Dual estimation and the unscented transformation" by Eric Wan, Rudolph van der Merwe and Alex Nelson in Neural Information Processing Systems, 12, pp. 666-672 (MIT Press, 2000). The disclosures of the about referenced chapters are incorporated by reference as part of the specification of this application.

Different techniques can be used to infer the hidden states or parameters of a hidden Markov model. Examples above illustrate how the EKF can be used for recursive (online) estimation of the motion of the sample. Other methods recursive methods for inferring the states or parameters of a hidden Markov model include the iterated Extended Kalman filter, Gaussian sum filter, bootstrap filter, and particle filter to name a few. Furthermore, in some applications recursive estimation may not be needed. For example, if the motion of the sample is used for offline motion correction or there is a sufficient time delay between when the measurements arrive and when the correction must be performed. In these and other situations, non-recursive Bayesian estimation methods for estimating the unknown states and or parameters of the hidden markov model or models may be used. One example of such a technique is called the Rauch-Tung-Striebel (RTS) smoother.

One method to improve recursive estimates of $\hat{x}_k$ is to use a recursive Bayesian estimator called the iterated Extended Kalman Filter (IEKF). Let $\hat{x}_k(+)$ be the a posteriori estimate of the state, which corresponds to the corrected state $\hat{x}_k$ in Step 4 in FIG. 1. The IEKF operates to improve the accuracy of the a posteriori estimate by repeatedly calculating $\hat{x}_k(+)$, $K_k$, and $P_k(+)$, each time linearizing about the most recent estimate. In this algorithm, the ith estimate of $x_k(+)$ is represented by $\hat{x}_{k,i}(+)$, i=0, 1, ... N, with $\hat{x}_{k,0}(+)=\hat{x}_k(-)$ where $\hat{x}_k(-)$ is the a priori estimate of the state (i.e. the predicted state or $\hat{x}_k$ in Step 1 of FIG. 1. Then, let $$H_k(\hat{x}_{k,i}(+)) = \frac{\partial h_k}{\partial x_k}\bigg|_{x_k=\hat{x}_{k,i}(+)}$$

be the term for repeated linearization of the nonlinear function h at the ith a posteriori estimate. This leads to a new set of IEKF correction equations:

$$\hat{x}_{k,i+1}(+)=\hat{x}_k(-)+K_{k,i}[z_k-h_k(\hat{x}_{k,i}(+))-H_k(\hat{x}_{k,i}(+))(\hat{x}_k(-)-\hat{x}_{k,i}(+))]$$

$$K_{k,i}=P_k(-)H_k^T(\hat{x}_{k,i}(+))[H_k(\hat{x}_{k,i}(+))P_k(-)H_k^T(\hat{x}_{k,i}(+))+R_k]^{-1}$$

$$P_{k,i+1}(+)=[I-K_{k,i}H_k(\hat{x}_{k,i}(+))]P_k(-)$$

Figure 6:
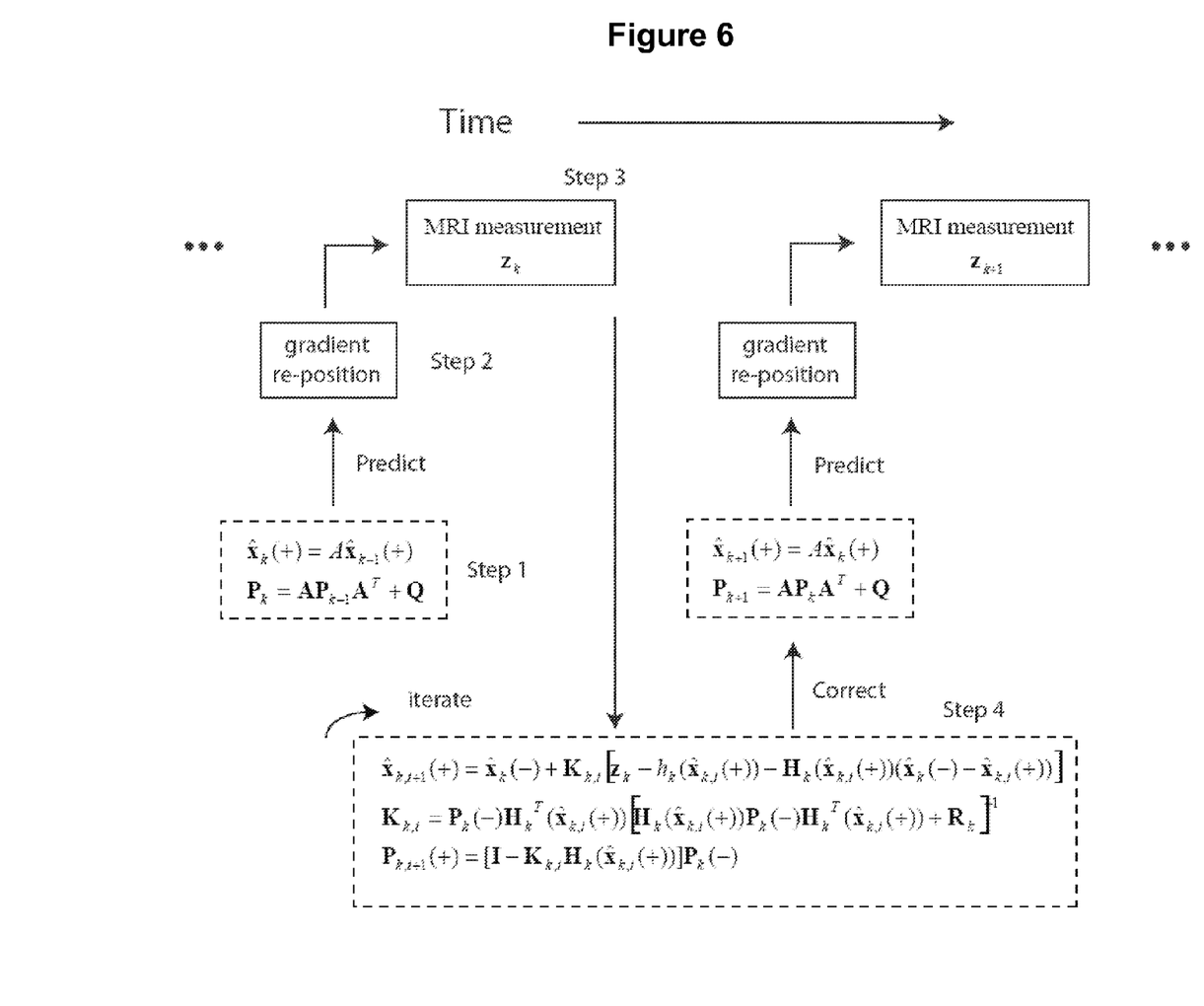
FIG. 6 shows an example of an iteration EKF algorithm for recursive motion estimation.

FIG. 6 shows an example of the IEKF algorithm for recursive motion estimation where iteration is performed at the step 4.

Figure 7:
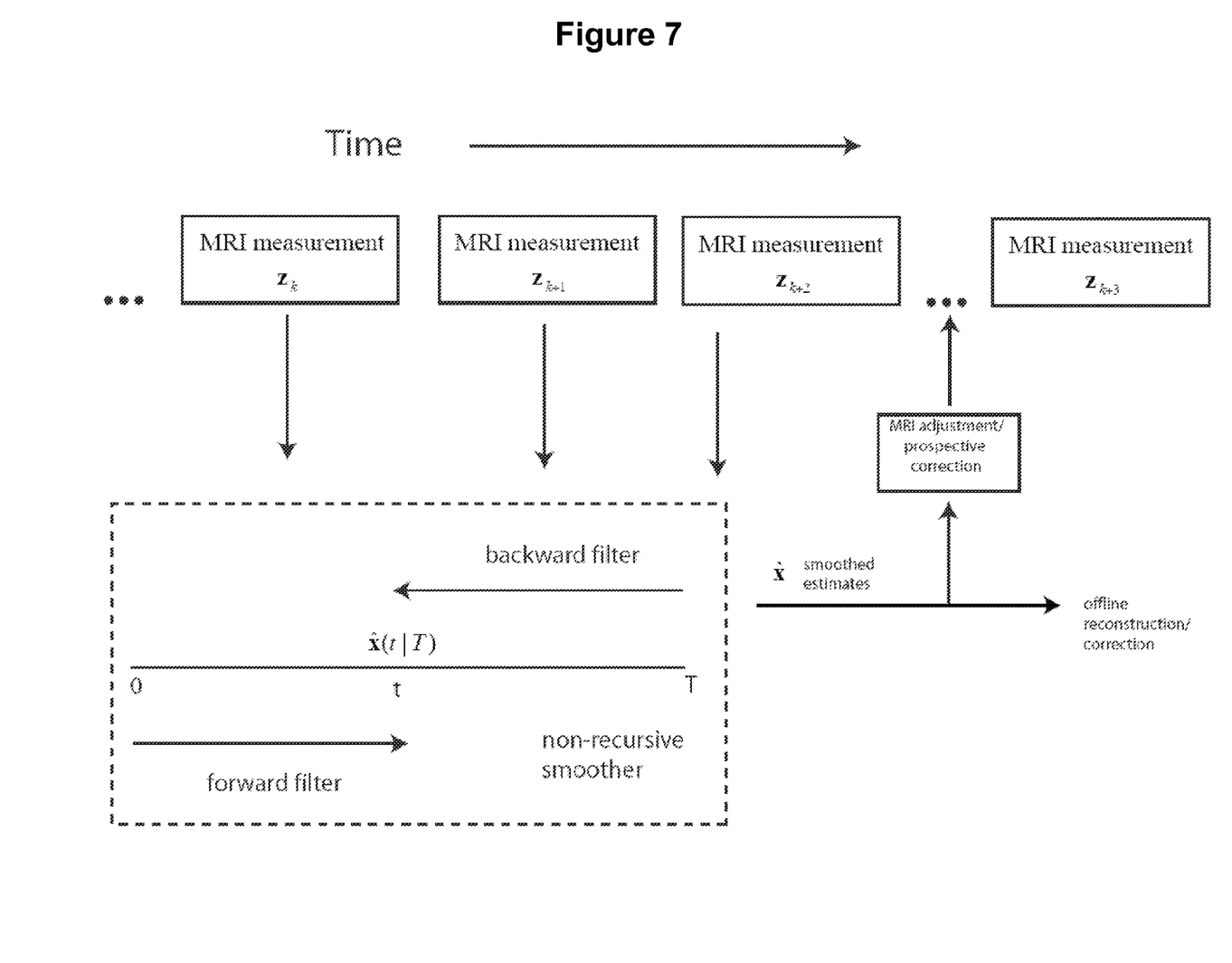
FIG. 7 shows a motion estimation in MRI using a non-recursive estimation process.

FIG. 7 shows an example for smoothing in motion estimate based on non-recursive state or parameter estimation in hidden Markov models. Smoothing is a non-real-time data processing scheme that uses all measurements between 0 and time T to estimate the state of a system at a certain time t, where $0 \leq t \leq T$. The smoothed estimate of the state vector $\hat{x}(t)$ based on all measurements between 0 and T is denoted by $\hat{x}(t|T)$. An optimal smoother is analogous to a suitable combination of two optimal filters. One of the filters, a "forward filter" as illustrated, operates on all the data before time t, while the second filter a "backward filter" as illustrated, operates on all the data between time T and t. Together, these two filters use all the available information and process the data as a batch. There are generally three types of smoothing, 1)

fixed-interval smoothing, 2) fixed-point smoothing, and 3) fixed-lag smoothing. Any of these smoothing techniques can be used in a non-recursive framework for estimating dynamic motion in MRI and these estimates can be used in a (non)real-time prospective correction scheme or used strictly for offline correction or reconstruction.

Figure 4:
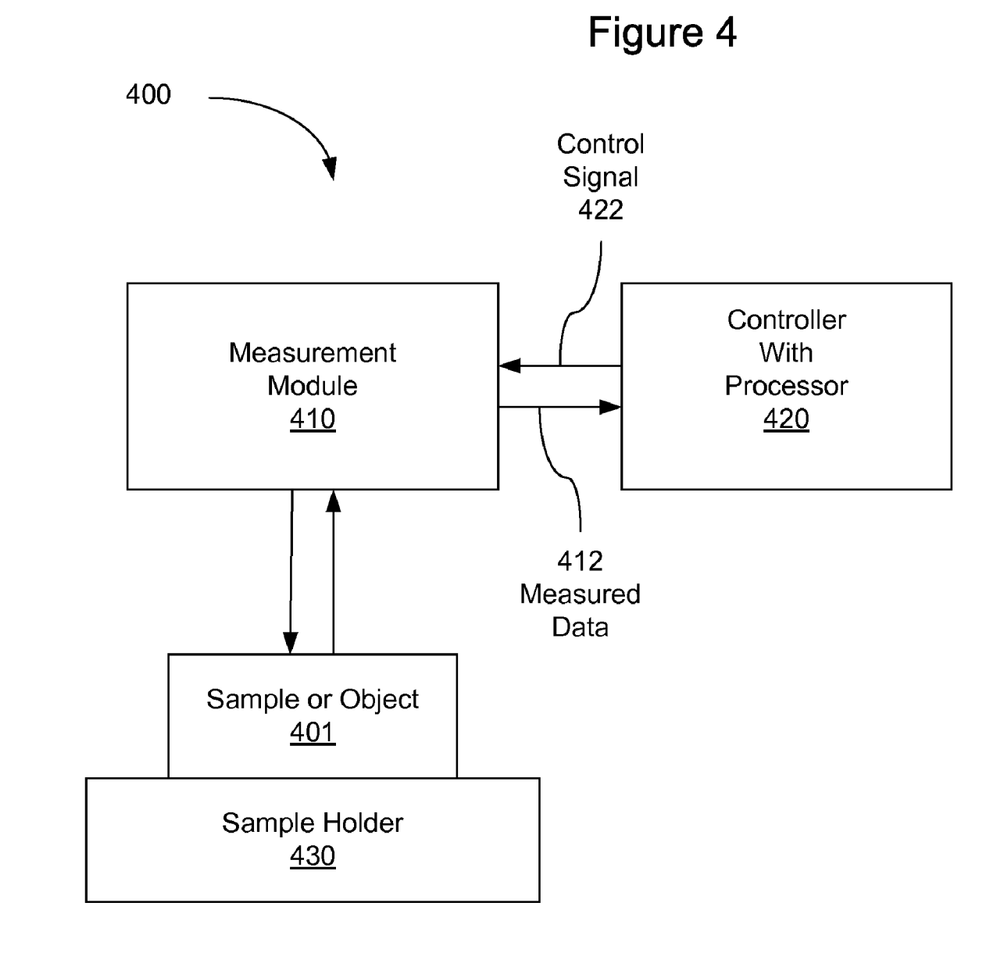
FIG. 4 shows one example of a measurement system that implements a motion sensing mechanism based on a hidden Markov model.

FIG. 4 shows an example of a biomedical imaging or measurement system 400 that implements the motion sensing and estimation based on measured data from the sample. The system 400 includes a measurement module 410 that is operable to measure a sample 401 (e.g., the brain or other part of a patient) by obtain biomedical image data or other data 412 ("measured data") from the sample 401. The measurement module 410 can be one of a range of biomedical imaging devices, including a magnetic resonance imaging (MRI) system, a positron emission tomography (PET) imaging system, a computed tomography (CT) imaging system, and an ultrasound imaging system. The measurement module 410 can also be a non-imaging system to measure data of the sample that is not an image of the sample 401. The system 400 provides a sample holder 430 to hold the sample 401 for measurement under the module 410. In an MRI system, the sample holder 430 is a table on which the patient lies.

In the system 400, a controller 420 is provided to be in communication with the module 410 to receive the measured data 412 and is operable to generate and apply a control signal 422 to the module 410 to control the operations of the module 410. A processor such as a microprocessor in form of a computer is included in the controller 420 to perform the motion sensing and estimation based on the measured data 412 based on the techniques described in this application. In one implementation, the measured data is not direct data on a motion in the sample and a property of the measured data is affected by the motion in the sample. The processor can process the measured data 412 to extract the effect of the motion on the measured data 412. For example, the processor can be programmed to apply a hidden Markov model of the temporal dynamics between a motion of the sample 401 and measured data 412 from the sample 401 to process the measured data 412 and to provide information on a motion in or of the sample 401. In the examples described above, the mathematical model is a hidden Markov model. The application of the hidden Markov model can include, in one implementation, applying a recursive estimation process under the hidden Markov model to estimate a motion of the sample from the biomedical imaging data and using the estimated motion to control an imaging condition for imaging the sample to reduce an effect of the motion of the sample on an obtained image of the sample. The recursive estimation process may use a recursive Bayesian estimation filter to estimate the motion. The recursive Bayesian estimation filter may be an extended Kalman filter. In particular, the processor can be programmed to perform the process shown in FIG. 1. The controller can use the information of the motion from application of the hidden Markov model in processing the measured data 412 to adjust a property of the system, e.g., the operation of the module 410 in measuring the sample 401, to reduce an effect of the motion in the measured data 412.

Figure 5:
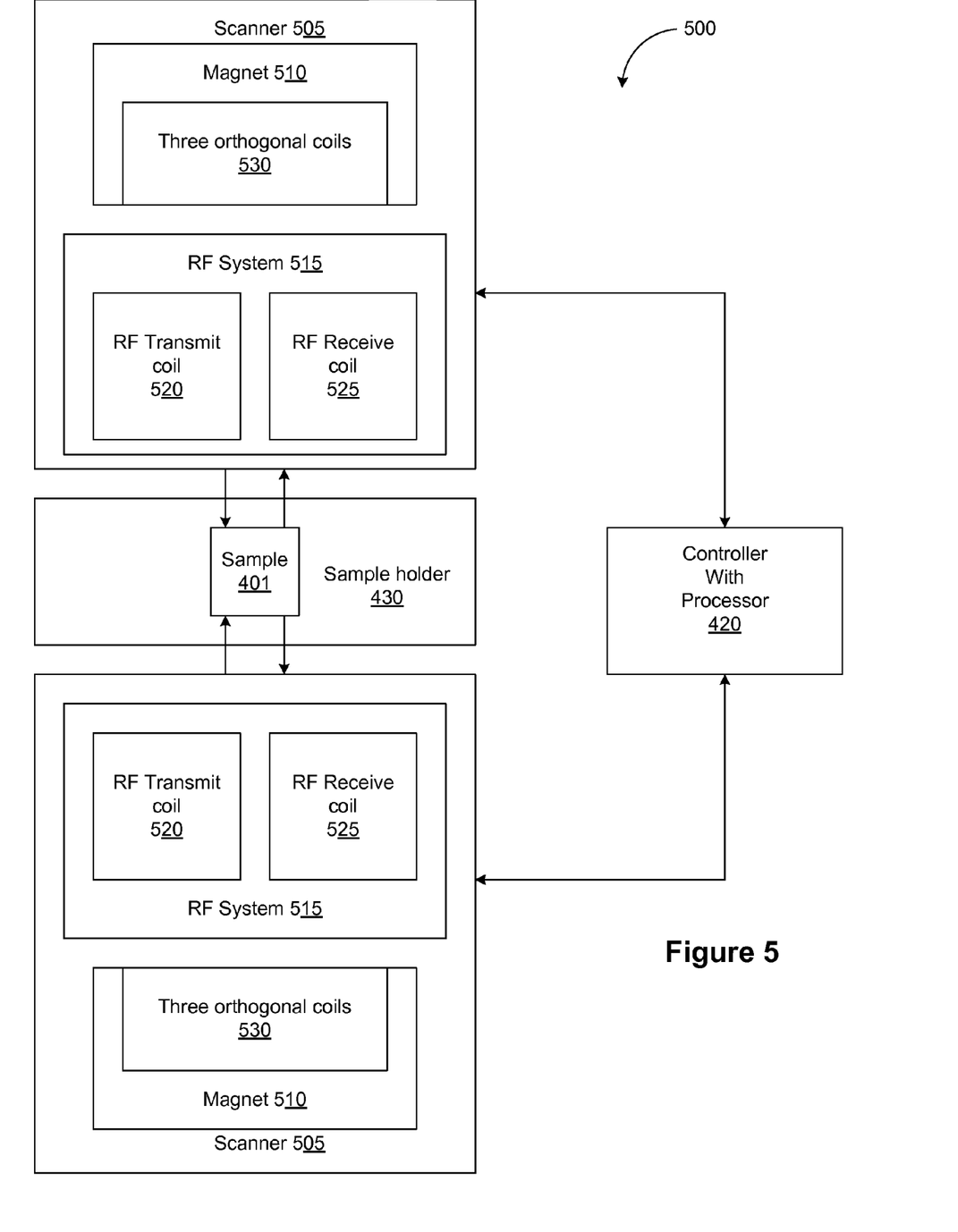
FIG. 5 shows an example of an MRI system that implements the system in FIG. 4.

FIG. 5 illustrates an example of an MRI system 500 as an exemplary implementation of the system 400 in FIG. 4. The MRI system 500 can be implemented using any one of various MRI scanners such as a 1.5 T Sigma TwinSpeed scanner (available from GE Healthcare Technologies, Milwaukee, Wis.). The MRI system 500 can include a scanner 505, a controller 420 with data processing apparatus, and a sample holder or table 430 for holding a sample 401. The scanner can include a main magnet 510, three orthogonal gradient coils 530 and an RF system 515 with RF coils for sending encoding and slice RF pulses to the sample and detecting the RF signals from the sample. The main magnet 510 can be designed to provide a constant, homogeneous magnetic field. The three orthogonal gradient coils 530 can be designed to provide three orthogonal, controller magnetic gradients used to acquire image data of a desired slice by generating an encoded and slice-selective magnetic field. The RF system 515 can include an RF transmit coil 520 and an RF receive coil 525 designed to transmit and receive RF pulses. The RF system 515 can further include an RF synthesizer (not shown) and a power amplifier (not shown). In some implementations, an integrated transceiver coil (not shown) can be implemented instead of the separate transmit coil 520 and receive coil 525 for transmitting and receiving RF signals. For example, a close-fitting smaller coil can improve image quality when a small region is being imaged. Further, various types of coils that are placed around specific parts of a body (e.g., the head, knee, wrist, and the like) or even internally can be implemented depending on the sample and imaging applications. The MRI system 500 can be designed to perform the techniques disclosed in this specification by the controller 420. The controller 420 can control the MRI system to apply the RF signals and various gradient fields to the sample for MRI imaging.

For example, the controller 420 in FIG. 5 can apply a recursive estimation process under a hidden Markov model to estimate a motion of the sample from acquired MRI data and can use the estimated motion to control a MRI gradient produced by the gradient coils 530 to reduce an effect of the motion of the sample. The recursive estimation process can use a recursive Bayesian estimation filter to estimate the motion. The recursive Bayesian estimation filter can be an extended Kalman filter. For another example, the controller 420 can use the recursive estimation process to estimate the motion of the sample after an RF pulse is applied to the sample to obtain each imaging slice when using a 2D MRI pulse sequence and before a subsequent RF pulse is applied and a second imaging slice of the sample is acquired.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine-generated electrical, optical, or electromagnetic signal, that is generated to encode information for transmission to suitable receiver apparatus for execution by a computer. The computer readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network. The processing techniques described in this specification, including the example of an EKF process for motion sensing in FIG. 1, can be implemented as computer codes.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Only a few implementations are described. Other implementations, variations and enhancements may be made based on what is described in this application.

What is claimed is:

1. A machine implemented method for sensing motion in a sample, comprising:

obtaining, at a controller comprising a processor, biomedical imaging data of the sample measured from a biomedical imaging device, wherein the obtained biomedical data is not direct data on the motion in the sample; and applying, at the controller, a first mathematical model of temporal dynamics between the motion of the sample and the biomedical imaging data to process the biomedical imaging data and to sense the motion in the sample, wherein the first mathematical model is a hidden Markov model, and wherein the application of the hidden Markov model includes:

applying a recursive estimation process under the hidden Markov model to estimate the motion of the sample from the biomedical imaging data; and using the estimated motion to control an imaging condition in imaging the sample to obtain the biomedical imaging data to reduce an effect of the motion of the sample on an obtained image of the sample.

2. The method as in claim 1, further comprising:
configuring a state vector in the hidden Markov model to indicate rigid body motion of the sample.

3. The method as in claim 2, wherein the state vector indicates a non-rigid-body motion of the sample.

4. The method as in claim 3, wherein the state vector indicates a non-linear deformation in the sample.

5. The method as in claim 1, wherein the recursive estimation process uses a recursive Bayesian estimation filter to estimate the motion.

6. The method as in claim 1, wherein the recursive Bayesian estimation filter is an extended Kalman filter.

7. The method as in claim 1, wherein the biomedical imaging data is imaging data from a magnetic resonance imaging (MRI) system.

8. The method as in claim 1, wherein the biomedical imaging data is imaging data from a positron emission tomography (PET) imaging system.

9. The method as in claim 1, wherein the biomedical imaging data is imaging data from a computed tomography (CT) imaging system.

10. The method as in claim 1, wherein the biomedical imaging data is imaging data from an ultrasound imaging system.

11. The method as in claim 1, further comprising:
applying a second mathematical model between a sample parameter of the sample, which is not a measurement of the sample motion, and the biomedical imaging data, to process the biomedical imaging data and to measure sample parameter, wherein information obtained from the second mathematical model is used to modify at least one parameter associated with the first mathematical model to improve the estimated motion.

12. The method as in claim 11, wherein the mathematical model for sensing the motion of the sample is a first extended Kalman filter, and the second mathematical model for measuring the sample parameter is a second, different extended Kalman filter.

13. The method as in claim 12, further comprising:
using information from the second extended Kalman filter to modify the processing in the first extended Kalman filter for sensing the motion to improve sensing the motion in the sample.

14. The method as in claim 1, wherein the application of the hidden Markov model includes:
applying a non-recursive estimation process under the hidden Markov model to estimate a motion of the sample from the biomedical imaging data.

15. The method as in claim 1, wherein the application of the hidden Markov model includes:
applying a non-recursive estimation process under the hidden Markov model to estimate a motion of the sample from the biomedical imaging data; and
using the estimated motion to control an imaging condition in imaging the sample to obtain the biomedical imaging data to reduce an effect of the motion of the sample on an obtained image of the sample.

16. A machine implemented method for sensing motion of a sample in magnetic resonance imaging (MRI), comprising:
obtaining, at a controller comprising a processor, MRI data acquired from an MRI device, wherein the acquired MRI data is not direct data on the motion in the sample;
applying, at the controller, a recursive estimation process under a hidden Markov model of temporal dynamics between the motion of the sample and the acquired MRI data to estimate the motion of the sample from the acquired MRI data; and
using the estimated motion to control a MRI gradient to reduce an effect of the motion of the sample.

17. The method as in claim 16, wherein the recursive estimation process uses a recursive Bayesian estimation filter to estimate the motion.

18. The method as in claim 17, wherein the recursive Bayesian estimation filter is an extended Kalman filter.

19. The method as in claim 17, further comprising using the recursive estimation process to estimate the motion of the sample after an RF pulse of a corresponding MRI system is applied to the sample to obtain each imaging slice when using a 2-dimensional MRI pulse sequence and before a subsequent RF pulse is applied and a second imaging slice of the sample is acquired.

20. The method as in claim 16, further comprising:
applying a second recursive estimation process under a hidden Markov model to estimate a sample parameter of the sample, which is not a measurement of the sample motion; and
using information from the second recursive estimation process to modify the processing in the first recursive estimation process for sensing the motion to improve sensing the motion in the sample.

21. The method as in claim 20, wherein the first recursive estimation process is a first extended Kalman filter, and the second recursive estimation process for measuring the sample parameter is a second, different extended Kalman filter.

22. The method as in claim 16, further comprising:
applying a second motion sensing process to monitor the motion of the sample, the second motion sensing process being separate from the recursive estimation process to estimate the motion of the sample from acquired MRI data; and
applying information obtained from both the second motion sensing process and the recursive estimation process to estimate the motion of the sample.

23. The method as in claim 22, wherein the second motion sensing process is a process that directly measures the motion of the sample.

24. The method as in claim 23, wherein the second motion sensing process is a prospective motion tracking process for MRI in which the motion of the sample is tracked or estimated sequentially in time during a acquisition period for obtaining MRI data from the sample.

25. The method as in claim 23, wherein the second motion sensing process tracks fiducial markers which are visible in the MR image or uses optical tracking of reflectors fixed to the sample.

26. A machine implemented method for sensing motion of a sample under measurement of a system, comprising:
obtaining, at a controller device comprising a processor, measured data of the sample from the system, wherein the measured data is not direct data on the motion in the sample and a property of the measured data is affected by the motion in the sample; and
applying, at the controller device, a hidden Markov model of temporal dynamics between the motion of the sample and the measured data to process the measured data for sensing the motion in the sample.

27. The method as in claim 26, wherein the system is a non-imaging system to measure data of the sample that is not an image of the sample.

28. The method as in claim 27, further comprising using information of the motion from application of the hidden Markov model in processing the measured data to adjust a property of the system in measuring the sample to reduce an effect of the motion.

29. The method as in claim 26, wherein the system is an imaging system operable to capture an image of at least a portion of the sample.

30. The method as in claim 29, wherein the imaging system is a magnetic resonance imaging (MRI) system.

31. The method as in claim 29, wherein the imaging system is a positron emission tomography (PET) imaging system.

32. The method as in claim 29, wherein the imaging system is a computed tomography (CT) imaging system.

33. The method as in claim 29, wherein the imaging system is an ultrasound imaging system.

34. The method as in claim 26, further comprising:
configuring a state vector in the hidden Markov model to indicate rigid body motion of the sample.

35. The method as in claim 34, wherein the state vector indicates a non-rigid-body motion of the sample.

36. The method as in claim 35, wherein the state vector indicates a non-linear deformation in the sample.

37. A system, comprising:
a measurement module operable to measure data from a sample, wherein the measured data is not direct data on a motion in the sample; and
a processor operable to apply a first hidden Markov model of temporal dynamics between the motion of the sample and the measured data from the sample to process the measured data and to provide information on the motion in or of the sample.

38. The system as in claim 37, wherein the measurement module comprises an imaging device.

39. The system as in claim 38, wherein the imaging device comprises a magnetic resonance imaging (MRI) device.

40. The system as in claim 38, wherein the imaging device comprises a positron emission tomography (PET) imaging system.

41. The system as in claim 38, wherein the imaging device comprises a computed tomography (CT) imaging system.

42. The system as in claim 38, wherein the imaging device comprises an ultrasound imaging system.

43. The system as in claim 38, wherein the processor uses a state vector in the hidden Markov model to indicate rigid body motion of the sample.

44. The system as in claim 43, wherein the state vector indicates a non-rigid-body motion of the sample.

45. The system as in claim 43, wherein the state vector indicates a non-linear deformation in the sample.

46. The system as in claim 38, wherein the processor includes a second a hidden Markov model between a sample parameter of the sample, which is not a measurement of the sample motion and the measured data, and the processor operates to process the measured data and to measure sample parameter, wherein information obtained from the second hidden Markov model is used to modify at least one parameter associated with the first hidden Markov model to improve the estimated motion provided on the motion in or of the sample.

47. The system as in claim 46, wherein the hidden Markov model for sensing the motion of the sample is implemented as a first extended Kalman filter, and the second hidden Markov model for measuring the sample parameter is implemented as a second, different extended Kalman filter.

48. The system as in claim 47, wherein the processor is operable to use information from the second extended Kalman filter to modify the processing in the first extended Kalman filter for sensing the motion to improve sensing the motion in the sample.

49. The system as in claim 37, further comprising:
a motion sensing mechanism based on a second motion sensing process to monitor the motion of the sample, the second motion sensing process being separate from the hidden Markov model to estimate the motion of the sample, and
wherein the processor is operable to apply information obtained from both the second motion sensing process and the hidden Markov model to estimate the motion of the sample.

50. The system as in claim 49, wherein the second motion sensing process is a process that directly measures the motion of the sample.

51. The system as in claim 50, wherein the second motion sensing process is a prospective motion tracking process for MRI in which the motion of the sample is tracked or estimated sequentially in time during a acquisition period for obtaining MRI data from the sample.

52. The system as in claim 50, wherein the second motion sensing process tracks fiducial markers which are visible in the measured data or uses optical tracking of reflectors fixed to the sample.

53. A computer program product, embodied on a non-transitory computer-readable medium, operable to cause the processor to perform operations comprising the method of claim 1.

54. A computer program product, embodied on a non-transitory computer-readable medium, operable to cause the processor to perform operations comprising the method of claim 11.

55. A computer program product, embodied on a non-transitory computer-readable medium, operable to cause the processor to perform operations comprising the method of claim 16.

56. A computer program product, embodied on a non-transitory computer-readable medium, operable to cause the processor to perform operations comprising the method of claim 20.

57. A computer program product, embodied on a non-transitory computer-readable medium, operable to cause the processor to perform operations comprising the method of claim 22.

58. A computer program product, embodied on a non-transitory computer-readable medium, operable to cause the processor to perform operations comprising the method of claim 26.

59. A computer program product, embodied on a non-transitory computer-readable medium, operable to cause the processor to perform operations comprising the method of claim 14.

60. A computer program product, embodied on a non-transitory computer-readable medium, operable to cause the processor to perform operations comprising the method of claim 15.

* * * * *

UNITED STATES PATENT AND TRADEMARK OFFICE
CERTIFICATE OF CORRECTION

PATENT NO. : 8,191,359 B2
APPLICATION NO. : 11/735409
DATED : June 5, 2012
INVENTOR(S) : Nathan White and Anders Dale

Page 1 of 1

It is certified that error appears in the above-identified patent and that said Letters Patent is hereby corrected as shown below:

In Column 5, Line 63, please delete "$m_3$]" and insert -- $m_3]^T$ --, therefor.

In Column 17, Line 59, in Claim 46, please delete "estimated motion" and insert -- information --, therefor.

Signed and Sealed this
Seventh Day of August, 2012

David J. Kappos
*Director of the United States Patent and Trademark Office*